（12）United States Patent
Gan et al.

(10) Patent No.: US 9,166,143 B1
(45) Date of Patent: Oct. 20, 2015

(54) MAGNETIC RANDOM ACCESS MEMORY WITH MULTIPLE FREE LAYERS

(71) Applicant: Avalanche Technology Inc., Fremont, CA (US)

(72) Inventors: Huadong Gan, Fremont, CA (US); Xiaobin Wang, Fremont, CA (US); Yuchen Zhou, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 22 days.

(21) Appl. No.: 14/304,775

(22) Filed: Jun. 13, 2014

(51) Int. Cl.
*H01L 29/82* (2006.01)
*H01L 43/02* (2006.01)
*H01L 43/10* (2006.01)

(52) U.S. Cl.
CPC ............... *H01L 43/02* (2013.01); *H01L 43/10* (2013.01)

(58) Field of Classification Search
CPC .................................. H01L 43/10; H01L 43/02
USPC ........................................................ 257/421
See application file for complete search history.

(56) References Cited

U.S. PATENT DOCUMENTS

| | | | |
|---|---|---|---|
| 2013/0134534 A1* | 5/2013 | Sbiaa | G11C 11/16 257/421 |
| 2014/0070341 A1* | 3/2014 | Beach | H01L 29/82 257/421 |
| 2014/0204662 A1* | 7/2014 | Zhou | G11C 11/5607 365/158 |
| 2015/0102439 A1* | 4/2015 | Gan | H01F 10/3286 257/421 |
| 2015/0102441 A1* | 4/2015 | Gan | H01L 43/02 257/422 |
| 2015/0109853 A1* | 4/2015 | Sato | H01L 43/08 365/158 |

* cited by examiner

*Primary Examiner* — Douglas Menz
(74) *Attorney, Agent, or Firm* — Bing K. Yen

(57) ABSTRACT

The present invention is directed to a magnetic random access memory element comprising a first magnetic reference layer, a first insulating tunnel junction layer, a first magnetic free layer, a first coupling layer, a second magnetic free layer, a second coupling layer, a third magnetic free layer, a second insulating tunnel junction layer, and a second magnetic reference layer formed in sequence. The first and second magnetic reference layers have respectively a first and second fixed magnetization directions that are substantially perpendicular to respective layer planes and are substantially opposite to each other. The first, second, and third magnetic free layers have respectively a first, second, and third variable magnetization directions that are substantially perpendicular to respective layer planes. The second variable magnetization direction may be parallel or anti-parallel to the first and third variable magnetization directions.

14 Claims, 6 Drawing Sheets

MAGNETIC RANDOM ACCESS MEMORY WITH MULTIPLE FREE LAYERS

BACKGROUND

The present invention relates to a magnetic random access memory (MRAM) device, and more particularly, to a spin transfer torque MRAM device including multiple magnetic free layers coupled in series.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection element coupled in series between appropriate electrodes. Upon application of a switching current to the magnetic memory element, the electrical resistance of the magnetic memory element would change accordingly, thereby switching the stored logic in the respective memory cell.

FIG. 1 shows a conventional memory element for an STT-MRAM device comprising a magnetic reference layer 50 and a magnetic free layer 52 with an insulating tunnel junction layer 54 interposed therebetween, thereby collectively forming a magnetic tunneling junction (MTJ) 56. The magnetic reference layer 50 and free layer 52 have magnetization directions 58 and 60, respectively, which are substantially perpendicular to the layer planes. Therefore, the MTJ 56 is a perpendicular type comprising the magnetic layers 50 and 52 with perpendicular anisotropy. Upon application of a switching current to the perpendicular MTJ 56, the magnetization direction 60 of the magnetic free layer 52 can be switched between two directions: parallel and anti-parallel with respect to the magnetization direction 58 of the magnetic reference layer 50. The insulating tunnel junction layer 54 is normally made of a dielectric material with a thickness ranging from a few to a few tens of angstroms. When the magnetization directions 60 and 58 of the magnetic free layer 52 and reference layer 50 are substantially parallel, electrons polarized by the magnetic reference layer 50 can tunnel through the insulating tunnel junction layer 54, thereby decreasing the electrical resistivity of the perpendicular MTJ 56. Conversely, the electrical resistivity of the perpendicular MTJ 56 is high when the magnetization directions 58 and 60 of the magnetic reference layer 50 and free layer 52 are substantially anti-parallel. Accordingly, the stored logic in the magnetic memory element can be switched by changing the magnetization direction 60 of the magnetic free layer 52.

One of many advantages of STT-MRAM over other types of non-volatile memories is scalability. As the size of the perpendicular MTJ 56 is reduced, however, the thermal stability of the magnetic layers 50 and 52, which is required for long term data retention, also degrades with miniaturization of the perpendicular MTJ 56. While the thermal stability of the perpendicular MTJ 56 may be improved by increasing the anisotropies and/or the magnetic moments of the magnetic layers 50 and 52, doing so would adversely increase the current required to switch the magnetization direction 60 of the magnetic free layer 52.

For the foregoing reasons, there is a need for an STT-MRAM device that has a thermally stable perpendicular MTJ memory element which can be programmed with a low switching current.

SUMMARY

The present invention is directed to a magnetic random access memory (MRAM) element that satisfies this need. An MRAM element having features of the present invention comprises a first magnetic reference layer, a first insulating tunnel junction layer, a first magnetic free layer, a first coupling layer, a second magnetic free layer, a second coupling layer, a third magnetic free layer, a second insulating tunnel junction layer, and a second magnetic reference layer formed in sequence. The first and second magnetic reference layers have respectively a first and second fixed magnetization directions that are substantially perpendicular to the respective layer planes and are substantially opposite to each other. The first, second, and third magnetic free layers have respectively a first, second, and third variable magnetization directions that are substantially perpendicular to the respective layer planes. The second variable magnetization direction may be parallel or anti-parallel to the first and third variable magnetization directions. The MRAM element may optionally include a cap layer overlying the second magnetic reference layer or a seed layer underlying the first magnetic reference layer or both.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Figure 1:
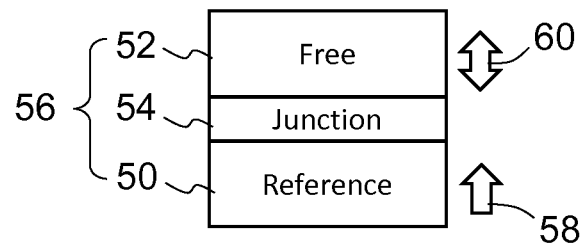
FIG. 1 is a cross sectional view of a conventional perpendicular magnetic tunnel junction.

In the Summary above and in the Detailed Description, and the claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of chemical element A and chemical element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "superlattice" means a synthetic periodic structure formed by interleaving layers of at least two constituent materials. A superlattice has at least two repeated unit stacks with each unit stack formed by laminating the constituent materials. Because of the periodic nature of its structure, a superlattice may exhibit characteristic satellite peaks when analyzed by diffraction methods, such as X-ray diffraction and neutron diffraction. For example, a $[Co/Pt]_n$ superlattice would denote a structure formed by n stacks of bilayer structure of cobalt (Co) and platinum (Pt).

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 mm and whose upper limit is 100 nm.

Figure 2:
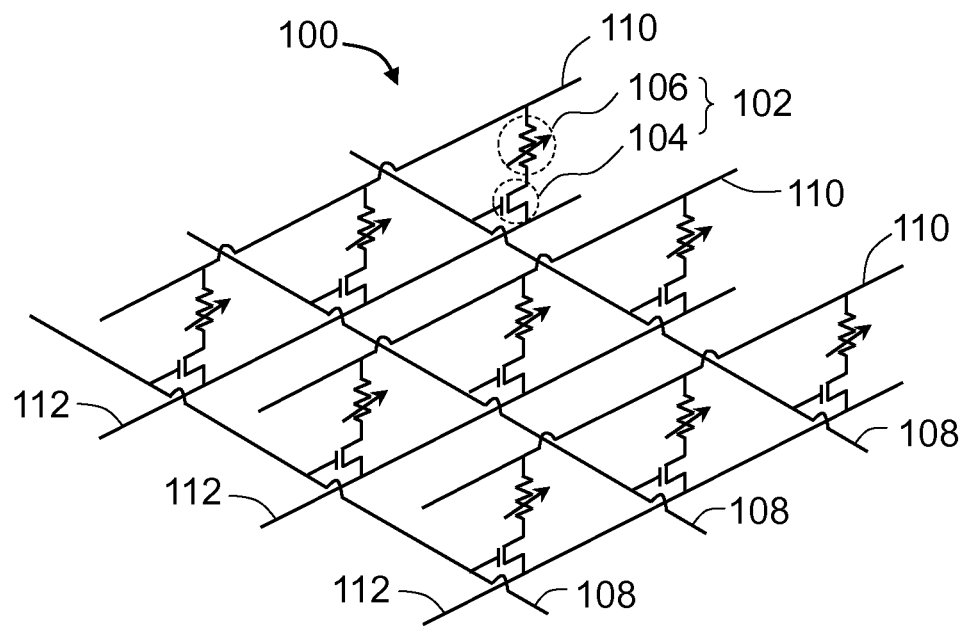
FIG. 2 is a schematic circuit diagram of an STT-MRAM device according to an embodiment of the present invention.

FIG. 2 is a schematic circuit diagram of an STT-MRAM device 100 according to an embodiment of the present invention. The STT-MRAM device 100 comprises a plurality of memory cells 102, each of the memory cells 102 including a selection transistor 104 coupled to a MTJ memory element 106; a plurality of parallel word lines 108 with each being coupled to a respective row of the selection transistors 104 in a first direction; and a plurality of parallel bit lines 110 with each being coupled to a respective row of the memory elements 106 in a second direction perpendicular to the first direction; and optionally a plurality of parallel source lines 112 with each being coupled to a respective row of the selection transistors 104 in the first or second direction.

Figure 3:
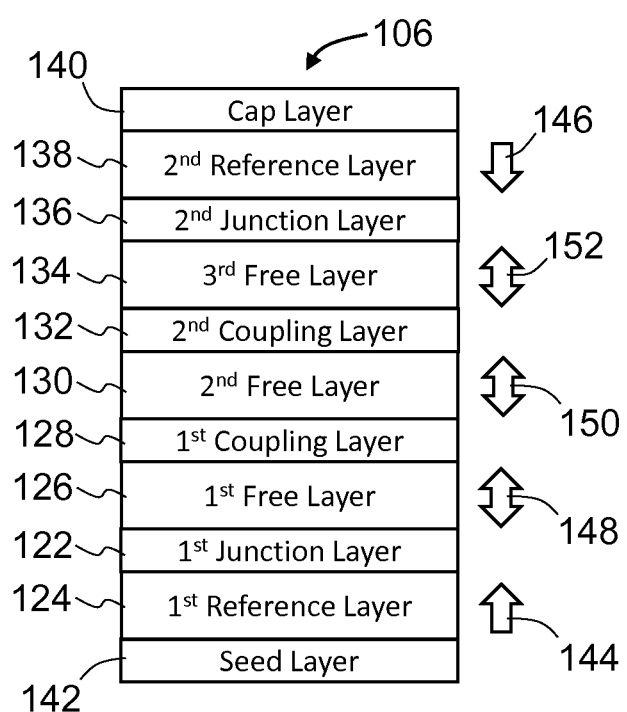
FIG. 3 is a cross sectional view of an embodiment of the present invention as applied to a perpendicular MTJ memory element having multiple magnetic free layers.

The MTJ memory element 106 has a perpendicular MTJ structure that includes multiple magnetic free layers. An embodiment of the present invention as applied to a perpendicular MTJ memory element will now be described with reference to FIG. 3. Referring now to FIG. 3, the illustrated perpendicular MTJ memory element 106 comprises a first tunnel junction layer 122 formed on top of a first magnetic reference layer 124, a first magnetic free layer 126 formed on top of the first insulating tunnel junction layer 122, a first coupling layer 128 formed on top of the first magnetic free layer 126, a second magnetic free layer 130 formed on top of the first coupling layer 128, a second coupling layer 132 formed on top of the second magnetic free layer 130, a third magnetic free layer 134 formed on top of the second coupling layer 132, a second insulating tunnel junction layer 136 formed on top of the third magnetic free layer 134, and a second magnetic reference layer 138 formed on top of the second insulating tunnel junction layer 136. The memory element 106 may include an optional cap layer 140 overlying the second magnetic reference layer 138 or an optional seed layer 142 underlying the first magnetic reference layer 124 or both.

The first and second magnetic reference layers 124 and 138 have respectively a first and second fixed magnetization directions 144 and 146 that are substantially perpendicular to the respective layer planes and are substantially opposite to each other. The first, second, and third magnetic free layers 126, 130, 134 have respectively a first, second, and third variable magnetization directions 148, 150, 152 that are substantially perpendicular to the respective layer planes. The three magnetic free layers 126, 130, and 134, which collectively behave as a composite free layer, are magnetically coupled in series through the first and second coupling layers 128 and 132. Moreover, the first and third variable magnetization directions 148 and 152 of the first and third magnetic free layers 126 and 134 are substantially the same or parallel to each other. In an embodiment, the first and third magnetic free layers 126 and 134 are anti-ferromagnetically coupled to the second magnetic free layer 130, resulting in the first and third variable magnetization directions 148 and 152 being opposite to the second variable magnetization direction 150. In another embodiment, the first and third magnetic free layers 126 and 134 are ferromagnetically coupled to the second magnetic free layer 130, resulting in all three variable magnetization directions 148-152 being substantially the same or parallel to each other.

One or more of the magnetic layers 124, 126, 130, 134, and 138 may comprise at least one ferromagnetic element, such as but not limited to cobalt (Co), nickel (Ni), or iron (Fe), to form a magnetic material, such as but not limited to Co, Ni, Fe, CoNi, CoFe, NiFe, or CoNiFe. The magnetic material of the one or more of the magnetic layers 124, 126, 130, 134, and 138 may further include at least one non-magnetic element, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), samarium (Sm), neodymium (Nd), or phosphorus (P), to form a magnetic alloy or compound, such as but not limited to cobalt-iron-boron (CoFeB), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB), samarium-cobalt (SmCo), neodymium-iron-boron (NdFeB), or cobalt-iron-phosphorous (CoFeP).

One or more of the magnetic layers 124, 126, 130, 134, and 138 may alternatively have a multilayer structure formed by interleaving layers of a first type of material with layers of a second type of material to form n number of stacks or repeats of a unit bilayer structure made of the two types of materials, where n is an integer greater or equal to 1. At least one of the two types of materials is magnetic. The multilayer structure, which is denoted by [first type material/second type material]$_n$, may be any suitable magnetic multilayer structure, such as but not limited to [Co/Pt]$_n$, [Co/Pd]$_n$, [Co/Ni]$_n$, [CoFe/Pt]$_n$, or [Co/Pt(Pd)]$_n$. The multilayer structure of the magnetic layers 124, 126, 130, 134, and 138 may or may not exhibit the characteristic satellite peaks associated with superlattice when analyzed by X-ray or neutron diffraction.

Figure 4A:
FIGS. 4A-4C are cross sectional views of embodiments of a magnetic reference or free layer according to an aspect of the present invention.
Figure 4B:
Figure 4C:
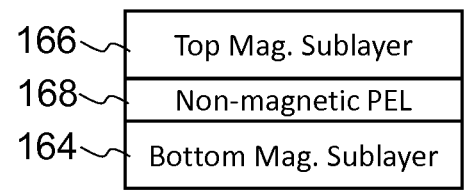

Still alternatively, one or more of the magnetic layers 124, 126, 130, 134, and 138 may comprise two or more magnetic sublayers. In an embodiment, one or more of the magnetic layers 124, 126, 130, 134, and 138 have a bilayer structure comprising a bottom magnetic sublayer 154 and a top magnetic sublayer 156 as illustrated in FIG. 4A. In another embodiment, one or more of the magnetic layers 124, 126, 130, 134, and 138 have a trilayer structure comprising a bottom magnetic sublayer 158, a middle magnetic sublayer 160, and a top magnetic sublayer 162 as illustrated in FIG. 4B. In still another embodiment, one or more of the magnetic layers 124, 126, 130, 134, and 138 has a trilayer structure comprising a bottom magnetic sublayer 164 and a top magnetic sublayer 166 with a non-magnetic perpendicular enhancement sublayer 168 interposed therebetween as illustrated in FIG. 4C. One or more of the magnetic sublayers 154-166 may be made of any suitable magnetic material, including alloy, compound, or multilayer structure, as described for the magnetic layers 124, 126, 130, 134, and 138 in the preceding paragraphs above. The non-magnetic perpendicular enhancement sublayer 168 may be made of tantalum (Ta), ruthenium (Ru), tungsten (W), magnesium oxide (MgO), or any combination thereof.

With continuing reference to FIG. 3, the first and second insulating tunnel junction layers 122 and 136 have energy barriers through which electrons can pass by tunnel effect. Each of the junction layers 122 and 136 may be made of any suitable insulating material, such as but not limited to magnesium oxide (MgO), aluminum oxide (AlOx), or any combination thereof.

The first and second coupling layers 128 and 132 provide either ferromagnetic coupling or anti-ferromagnetic coupling to the magnetic free layers 126, 130, and 134. In embodiments where the first and third variable magnetization directions 148 and 152 are substantially opposite to the second variable magnetization direction 150, one or both of the coupling layers 128 and 132 may be made of ruthenium (Ru), rhodium (Rh), iridium (Ir), copper (Cu), rhenium (Re), chromium (Cr), vanadium (V), molybdenum (Mo), tungsten (W), niobium (Nb), or tantalum (Ta). In an embodiment, both of the coupling layers 128 and 132 are made of ruthenium. In embodiments where the first, second, and third variable magnetization directions 148-152 are substantially the same, one or both of the coupling layers 128 and 132 may be made of Ti, Zr, Hf, V, Nb, Ta, Cr, Mo, W, Al, Si, Ge, Ga, O, N, C, Pt, Pd, or MgO.

One or both of the first and second coupling layers 128 and 132 may alternatively comprise two or more coupling sublayers. In an embodiment, one or both of the first and second coupling layers 128 and 132 have a bilayer structure with each sublayer thereof made of a suitable coupling material as described above.

The optional seed layer 142 or the optional cap layer 140 or both may be made of Ta, tantalum nitride (TaN), Ti, titanium nitride (TiN), W, Ru, copper (Cu), or copper nitride (CuN). Alternatively, the optional seed layer 142 or the optional cap layer 140 or both may have a multilayer structure formed by interleaving layers of a first type of material with layers of a second type of material to form n number of stacks or repeats of a unit bilayer structure made of the two types of materials, where n is an integer greater or equal to 1. The first type of material may comprise at least one non-magnetic element selected from the group consisting of titanium (Ti), zirconium (Zr), hafnium (Hf), vanadium (V), niobium (Nb), tantalum (Ta), chromium (Cr), molybdenum (Mo), tungsten (W), platinum (Pt), palladium (Pd), and ruthenium (Ru). Alternatively, the first type of material may comprise one or more ferromagnetic elements, such as but not limited to cobalt (Co), nickel (Ni), or iron (Fe), to form a material, such as but not limited to Co, Ni, Fe, CoNi, CoFe, NiFe, or CoNiFe. The first type of material may further include at least one non-magnetic element, such as but not limited to B, Ti, Zr, Hf, V, Nb, Ta, Cr, Mo, W, Al, Si, Ge, Ga, O, N, C, Pt, Pd, Ru, or P, to form an alloy or compound, such as but not limited to CoFeB, FeZrB, FePt, CoPt, CoFeBTi, CoFeBZr, CoFeBHf, CoFeBV, CoFeBTa, CoFeBCr, CoFeTi, CoFeZr, CoFeHf, CoFeV, CoFeNb, CoFeTa, CoFeCr, CoFeMo, CoFeW, CoFeAl, CoFeSi, CoFeGe, CoFeP, CoCr, CoCrB, CoCrPt, CoCrPtB, CoCrPd, CoCrTi, CoCrZr, CoCrHf, CoCrV, CoCrNb, or CoCrTa. The first type of material may be non-magnetic if the content of the magnetic elements is below the threshold required for becoming magnetized or if the thickness is thin enough to become superparamagnetic. The second type of material may be made of any suitable material for the first type of material as described above.

In an embodiment, the optional seed layer 142 is made of [Ta/CoFeB]$_n$ with the Ta and CoFeB layers having thicknesses of about 2.0 nm and about 0.6 nm, respectively. Both the 2.0 nm thick Ta and the 0.6 nm thick CoFeB may be amorphous. Moreover, the 0.6 nm thick CoFeB may be non-magnetic or superparamagnetic, thereby rendering the optional seed layer 142 non-magnetic. The [Ta/CoFeB]$_n$ seed layer preferably has 2 or 3 repeats of the unit bilayer structure, i.e. n=2 or 3, with one of the Ta layers in contact with the first magnetic reference layer 124.

Alternatively, the optional seed layer 142 or the optional cap layer 140 or both may be made of [CoFeB/Ru]$_n$, [CoFeB/FeZrB]$_n$, or [Ta/FeZrB]$_n$. In embodiments where Ta is absent, an optional underlayer made of Ta (not shown) may be inserted between the multilayered seed layer 142 and the magnetic reference layer 124 to prevent direct contact therebetween. The optional seed layer 142 or the optional cap layer 140 that has a multilayer structure may not exhibit the characteristic satellite peaks associated with superlattice when analyzed by X-ray or neutron diffraction, especially when one or both of the first and second type of materials are amorphous.

Figure 5A:
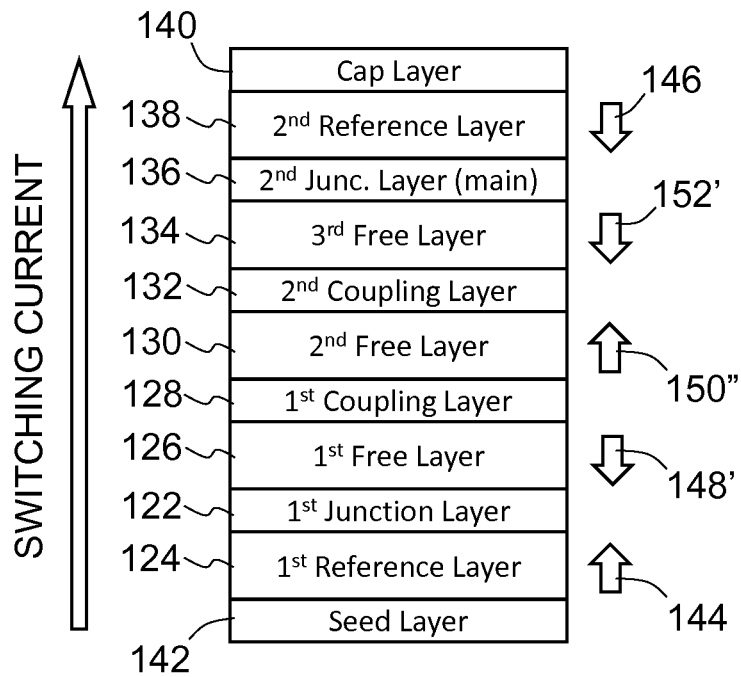
FIGS. 5A and 5B are cross sectional views illustrating effect of different switching currents on the magnetization configuration of a perpendicular MTJ memory element having three magnetic free layers anti-ferromagnetically coupled in series.
Figure 5B:
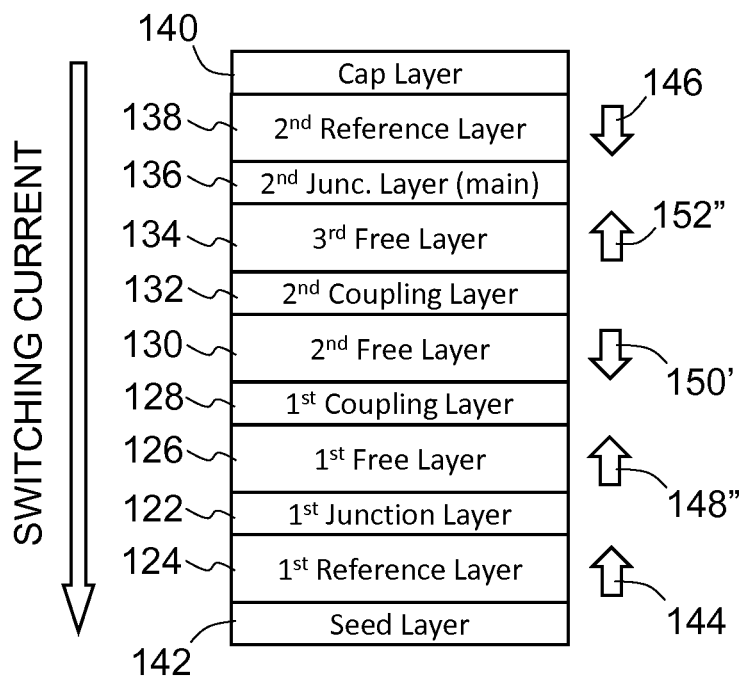

Operation of the MTJ memory element 106 shown in FIG. 3 will now be described with reference to FIGS. 5A, 5B, 6A, and 6B. In the drawings, numerals 122 to 146 denote the same components or features as those shown in FIG. 3. For embodiments in which the first and third variable magnetization directions 148 and 152 are substantially opposite to the second variable magnetization direction 150, FIGS. 5A and 5B illustrate the magnetization configurations of the MTJ memory element as switching currents with different directions pass therethrough. The MTJ memory element of FIGS. 5A and 5B includes two MTJs: the first MTJ comprising the first magnetic reference layer 124 and the first magnetic free layer 126 with the first insulating tunnel junction layer 122 interposed therebetween, and the second MTJ comprising the second magnetic reference layer 138 and the third magnetic free layer 134 with the second insulating tunnel junction layer 136 interposed therebetween. As illustrated in FIGS. 5A and 5B, the two MTJs in the MTJ memory element have opposite resistance states. Accordingly, one with a high tunnel magnetoresistance (TMR) ratio is the main MTJ while the other one with a low TMR ratio becomes the secondary MTJ. If the main and secondary MTJs were to have substantially the same TMR ratio, the low and high resistance states of the memory element may become indistinguishable as the resistance changes of the main and secondary MTJs always cancel each other.

In the embodiment illustrated in FIGS. 5A and 5B, the first and second MTJs are secondary and main MTJs, respectively. FIG. 5A shows after a upward switching current passes through the MTJ memory element, the main MTJ will be in the low resistance state since the third variable magnetization direction 152' is parallel to the second fixed magnetization direction 146, while the secondary MTJ is in the high resistance state since the first variable magnetization direction 148' is anti-parallel or opposite to the first fixed magnetization direction 144. Because the resistance decrease of the main MTJ is much larger than the resistance increase of the secondary MTJ, the overall resistance of the memory element is in the low state. In contrast, FIG. 5B shows the MTJ memory element will be in the high resistance state as a downward switching current causing the third variable magnetization direction 152" to become anti-parallel or opposite to the second fixed magnetization direction 146.

In the embodiment illustrated in FIGS. 5A and 5B, the first and third magnetic free layers 126 and 134 are anti-ferromagnetically coupled to the second magnetic free layer 130. The three magnetic free layers 126, 130, and 134 collectively behave like a single composite free layer. When an upward switching current is applied as shown in FIG. 5A, electrons flow downward through the two MTJs connected in series. When the electrons flow through the second MTJ on top, a spin transfer torque is exerted on the third magnetic free layer 134 to align the third variable magnetization direction 152' along the same direction as the second fixed magnetization direction 146. As the electrons continue to flow through the first MTJ on bottom, another spin transfer torque is exerted on the first magnetic free layer 126 to align the first variable magnetization direction 148' along the opposite direction as the first fixed magnetization direction 144. Accordingly, two spin transfer torques are exerted on the first and third magnetic free layers 126 and 134, which along with the second magnetic free layer 130, collectively behave as a composite free layer.

Figure 6A:
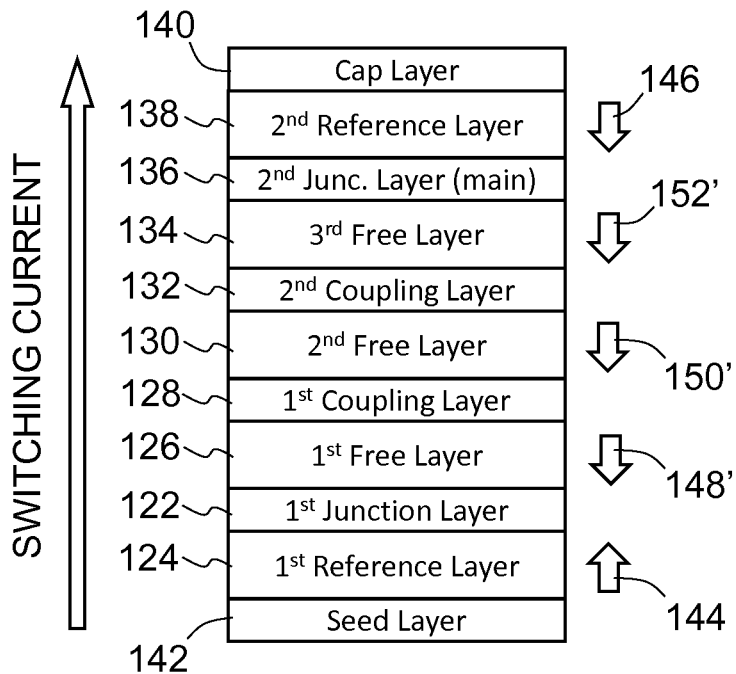
FIGS. 6A and 6B are cross sectional views illustrating effect of different switching currents on the magnetization configuration of a perpendicular MTJ memory element having three magnetic free layers ferromagnetically coupled in series.
Figure 6B:
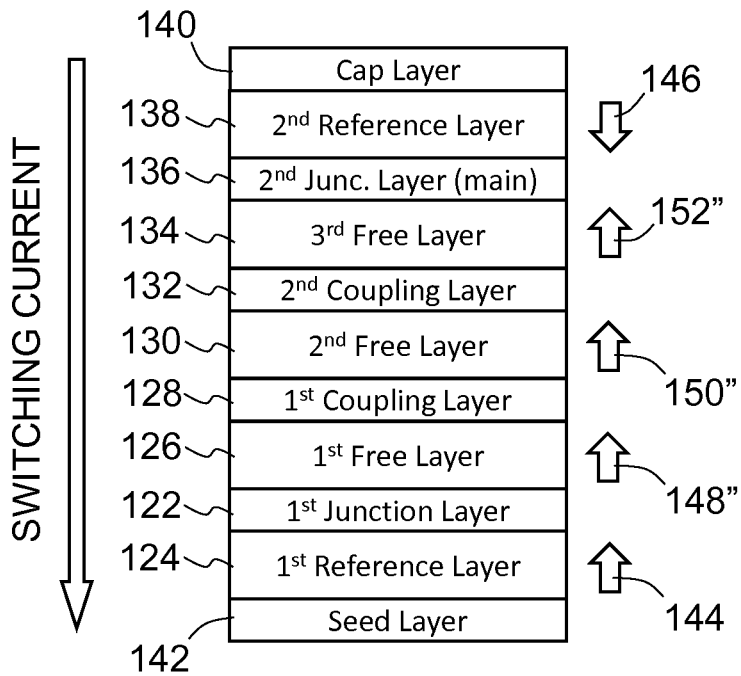

For embodiments in which the first, second, third variable magnetization directions 148-152 are substantially the same, FIGS. 6A and 6B illustrate the magnetization configurations of the MTJ memory element as switching currents with different directions pass therethrough. The MTJ memory element of FIGS. 6A and 6B is similar to that of FIGS. 5A and 5B except the first, second, and third magnetic free layers 126, 130, and 134 are ferromagnetically coupled. Accordingly, the second variable magnetization direction 150' or 150" of the second magnetic free layer 130 will be parallel to the first variable magnetization direction 148' or 148" and the third variable magnetization direction 152' or 152" regardless of the resistance state of the MTJ memory element. With the second MTJ being the main MTJ, FIG. 6A shows that an upward switching current causes the third variable magnetization direction 152' to become parallel to the second fixed magnetization direction 146, thereby rendering the MTJ memory element in the low resistance state. In contrast, FIG. 6B shows that a downward switching current causes the third variable magnetization direction 152" to become anti-parallel or opposite to the second fixed magnetization direction 146, rendering the MTJ memory element in the high resistance state.

Alternatively, the main MTJ may be the first MTJ instead of the second MTJ as shown in the embodiments of FIGS. 5A, 5B, 6A, and 6B. In the case where the main MTJ is the first MTJ, an upward and a downward switch currents will switch the MTJ memory element to the high and low resistance states, respectively.

Figure 7:
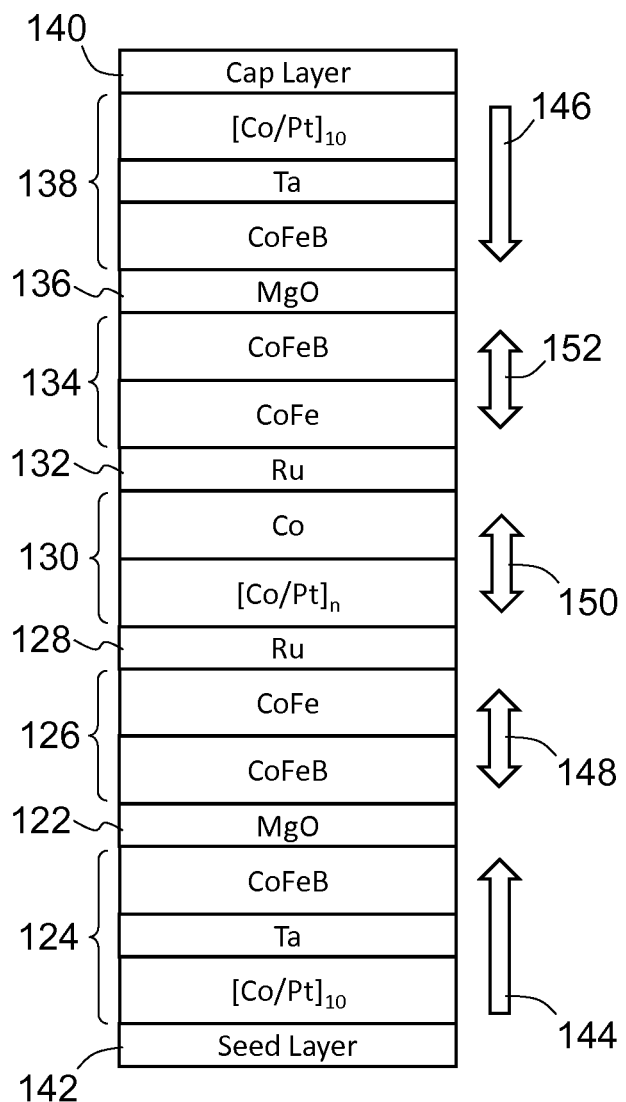
FIG. 7 is a cross sectional view of an exemplary perpendicular MTJ memory element in accordance with the present invention.

FIG. 7 illustrates an embodiment of the MTJ memory element in accordance with the present invention. In the drawing, numerals 122 to 152 denote the same components or features as those shown in FIG. 3. The first magnetic reference layer 124 includes a $[Co/Pt]_{10}$ sublayer, a CoFeB sublayer formed adjacent to the first insulating tunnel junction layer 122 made of MgO, and a Ta perpendicular enhancement sublayer between the $[Co/Pt]_{10}$ and CoFeB sublayers. The first magnetic free layer 126 has a bilayer structure comprising a CoFeB sublayer formed adjacent to the first insulating junction layer 122 made of MgO and a CoFe sublayer formed adjacent to the first coupling layer 128 made of Ru. The second magnetic free layer 130 includes a Co sublayer formed adjacent to the second coupling layer 132 made of Ru and a $[Co/Pt]_n$ sublayer with one of the Co layers of the $[Co/Pt]_n$ sublayer formed adjacent to the first coupling layer 128. The $[Co/Pt]_n$ sublayer of the second magnetic free layer 130 preferably has 1 to 10 repeats of the Co/Pt unit bilayer structure, i.e. n=1 to 10. The third magnetic free layer 134 has a bilayer structure comprising a CoFe sublayer formed adjacent to the second coupling layer 132 made of Ru and a CoFeB sublayer formed adjacent to the second insulating tunnel junction layer 136 made of MgO. The second magnetic reference layer 138 includes a CoFeB sublayer formed adjacent to the second insulating tunnel junction layer 136 and a $[Co/Pt]_{10}$ sublayer with a Ta perpendicular enhancement sublayer interposed therebetween. The first and third magnetic free layers 126 and 134 are anti-ferromagnetically coupled to the second magnetic free layer 130. Accordingly, the first and third variable magnetization directions 148 and 152 are substantially opposite to the second variable magnetization direction 150.

Compared with the conventional perpendicular MTJ 56 with a single free layer 52 as shown in FIG. 1, the memory element of the present invention has improved thermal stability owing to the three magnetic free layers coupled in series, which collectively behave as a composite free layer. Moreover, upon passage of a switching current through the memory element of the present invention, two spin transfer torques are generated at the two MTJs to switch the magnetization of the composite free layer, thereby minimizing the switching current.

All the features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

While the present invention has been shown and described with reference to certain preferred embodiments, it is to be understood that those skilled in the art will no doubt devise certain alterations and modifications thereto which nevertheless include the true spirit and scope of the present invention.

For example, the stacking order of the layers of the memory element 106 illustrated in FIG. 3 may be inverted without affecting the device performance. Thus the scope of the invention should be determined by the appended claims and their legal equivalents, rather than by examples given.

What is claimed is:

1. A magnetic random access memory element comprising a first magnetic reference layer, a first insulating tunnel junction layer, a first magnetic free layer, a first coupling layer, a second magnetic free layer, a second coupling layer, a third magnetic free layer, a second insulating tunnel junction layer, and a second magnetic reference layer formed in sequence, wherein said first and second magnetic reference layers have respectively a first and second fixed magnetization directions that are substantially perpendicular to respective layer planes and are substantially opposite to each other, said first, second, and third magnetic free layers have respectively a first, second, and third variable magnetization directions that are substantially perpendicular to respective layer planes.

2. The magnetic random access memory element of claim 1, wherein said first and third variable magnetization directions are substantially the same.

3. The magnetic random access memory element of claim 2, wherein said first and third variable magnetization directions are substantially opposite to said second variable magnetization direction.

4. The magnetic random access memory element of claim 3, wherein one or both of said first and second coupling layers are made of ruthenium.

5. The magnetic random access memory element of claim 2, wherein said first, second, and third variable magnetization directions are substantially the same.

6. The magnetic random access memory element of claim 5, wherein one or both of said first and second coupling layers are made of tantalum.

7. The magnetic random access memory element of claim 1, further comprising a seed layer underlying said first magnetic reference layer.

8. The magnetic random access memory element of claim 1, further comprising a cap layer overlying said second magnetic reference layer.

9. The magnetic random access memory element of claim 1, wherein one or both of said first and second insulating tunnel junction layers are made of magnesium oxide.

10. The magnetic random access memory element of claim 1, wherein one or more of said first magnetic reference layer, said second magnetic reference layer, said first magnetic free layer, said second magnetic free layer, and said third magnetic free layer have a structure comprising at least two magnetic sublayers.

11. The magnetic random access memory element of claim 10, wherein each of said first magnetic reference layer, said second magnetic reference layer, said first magnetic free layer, and said third magnetic free layer includes a CoFeB sublayer formed adjacent to said first or second insulating tunnel junction layer.

12. The magnetic random access memory element of claim 10, wherein each of said first, second, and third magnetic free layers includes at least one CoFe or Co sublayer formed adjacent to said first or second coupling layer.

13. The magnetic random access memory element of claim 10, wherein one or more of said first magnetic reference layer, said second magnetic reference layer, and said second magnetic free layer include a magnetic sublayer formed by interleaving layers of a first material with layers of a second material with at least one of said first and second materials being magnetic.

14. The magnetic random access memory element of claim 13, wherein said first material is cobalt and said second material is platinum, palladium, nickel, or any combination thereof.

* * * * *